United States Patent
Demone

(10) Patent No.: US 7,751,262 B2
(45) Date of Patent: Jul. 6, 2010

(54) HIGH SPEED DRAM ARCHITECTURE WITH UNIFORM ACCESS LATENCY

(75) Inventor: Paul Demone, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 12/249,413

(22) Filed: Oct. 10, 2008

(65) Prior Publication Data
US 2009/0034347 A1 Feb. 5, 2009

Related U.S. Application Data

(63) Continuation of application No. 11/367,589, filed on Mar. 6, 2006, now Pat. No. 7,450,444, which is a continuation of application No. 11/101,413, filed on Apr. 8, 2005, now Pat. No. 7,012,850, which is a continuation of application No. 10/804,182, filed on Mar. 19, 2004, now Pat. No. 6,891,772, which is a continuation of application No. 10/336,850, filed on Jan. 6, 2003, now Pat. No. 6,711,083, which is a continuation of application No. PCT/CA01/00949, filed on Jun. 29, 2001.

(60) Provisional application No. 60/216,679, filed on Jul. 7, 2000.

(30) Foreign Application Priority Data
Jul. 7, 2000 (CA) .................................. 2313954

(51) Int. Cl.
G11C 7/00 (2006.01)
G11C 8/00 (2006.01)

(52) U.S. Cl. .............. 365/194; 365/233.1; 365/230.06; 365/230.08

(58) Field of Classification Search ................. 365/194
See application file for complete search history.

(56) References Cited

U.S. PATENT DOCUMENTS 4,415,994 A   11/1983   Ive et al.

(Continued)

FOREIGN PATENT DOCUMENTS

CN   1142672 A   2/1997

(Continued)

OTHER PUBLICATIONS

PCT Patent Application No. PCT/CA2001/000949, International Search Report dated Apr. 12, 2002, p. 2.

(Continued)

*Primary Examiner*—Son L Mai
(74) *Attorney, Agent, or Firm*—Shin Hung; Borden Ladner Gervais LLP

(57) ABSTRACT

A Dynamic Random Access Memory (DRAM) performs read, write, and refresh operations. The DRAM includes a plurality of sub-arrays, each having a plurality of memory cells, each of which is coupled with a complementary bit line pair and a word line. The DRAM further includes a word line enable device for asserting a selected one of the word lines and a column select device for asserting a selected one of the bit line pairs. A timing circuit is provided for controlling the word line enable device, the column select device, and the read, write, and refresh operations in response to a word line timing pulse. The read, write, and refresh operation are performed in the same amount of time.

7 Claims, 16 Drawing Sheets

U.S. PATENT DOCUMENTS

| | | | |
|---|---|---|---|
| 4,633,441 A | 12/1986 | Ishimoto | |
| 4,658,354 A | 4/1987 | Nukiyama | |
| 4,796,234 A | 1/1989 | Itoh et al. | |
| 5,083,296 A * | 1/1992 | Hara et al. | 365/230.02 |
| 5,294,842 A | 3/1994 | Iknaian et al. | |
| 5,371,714 A | 12/1994 | Matsuda et al. | |
| 5,402,388 A | 3/1995 | Wojcicki et al. | |
| 5,544,124 A | 8/1996 | Zagar et al. | |
| 5,550,784 A | 8/1996 | Takai | |
| 5,579,267 A | 11/1996 | Koshikawa | |
| 5,655,105 A | 8/1997 | McLaury | |
| 5,657,285 A | 8/1997 | Rao | |
| 5,666,324 A * | 9/1997 | Kosugi et al. | 365/233.11 |
| 5,666,480 A | 9/1997 | Leung et al. | |
| 5,703,815 A | 12/1997 | Kuhara et al. | |
| 5,713,005 A | 1/1998 | Proebsting | |
| 5,748,560 A | 5/1998 | Sawada | |
| 5,784,705 A | 7/1998 | Leung | |
| 5,787,457 A | 7/1998 | Miller et al. | |
| RE35,934 E | 10/1998 | Takai | |
| 5,822,772 A | 10/1998 | Chan et al. | |
| 5,829,026 A | 10/1998 | Leung et al. | |
| 5,835,443 A | 11/1998 | Fujita | |
| 5,856,940 A | 1/1999 | Rao | |
| 5,901,086 A | 5/1999 | Wang et al. | |
| 5,903,509 A | 5/1999 | Ryan et al. | |
| 5,978,305 A | 11/1999 | Sasaki et al. | |
| 6,014,339 A | 1/2000 | Kobayashi et al. | |
| 6,067,274 A | 5/2000 | Yoshimoto | |
| 6,078,546 A | 6/2000 | Lee | |
| 6,084,823 A | 7/2000 | Suzuki et al. | |
| 6,091,629 A | 7/2000 | Osada et al. | |
| 6,108,229 A | 8/2000 | Shau | |
| 6,108,243 A | 8/2000 | Suzuki et al. | |
| 6,151,236 A | 11/2000 | Bondurant et al. | |
| 6,208,563 B1 * | 3/2001 | Naritake | 365/189.05 |
| 6,356,509 B1 | 3/2002 | Abdel-Hafeez et al. | |
| 6,359,831 B1 | 3/2002 | McLaury | |
| 6,360,294 B1 | 3/2002 | Ferrant et al. | |
| 6,427,197 B1 | 7/2002 | Sato et al. | |
| 6,510,492 B2 | 1/2003 | Hsu et al. | |
| 6,510,503 B2 | 1/2003 | Gillingham et al. | |
| 6,539,454 B2 | 3/2003 | Mes | |
| 6,650,573 B2 | 11/2003 | Sunaga et al. | |
| 6,711,083 B2 | 3/2004 | Demone | |
| 6,850,449 B2 | 2/2005 | Takahashi | |
| 6,876,592 B2 * | 4/2005 | Takahashi et al. | 365/222 |
| 6,891,772 B2 | 5/2005 | Demone | |
| 7,012,850 B2 | 3/2006 | Demone | |

FOREIGN PATENT DOCUMENTS

| | | |
|---|---|---|
| EP | 0179605 A2 | 4/1986 |
| EP | 0198673 | 10/1986 |
| EP | 0280882 A2 | 9/1988 |
| EP | 0517240 A2 | 12/1992 |
| EP | 0704848 A2 | 3/1996 |
| EP | 0704850 A2 | 4/1996 |
| EP | 0788110 A2 | 8/1997 |
| JP | 09091955 | 4/1997 |
| JP | 2000-137982 | 5/2000 |
| KR | 2000-17520 A | 2/2005 |

OTHER PUBLICATIONS

Kawaraha et al., "A Charge Recycle Refresh for Gb-Scale DRAM's in File Applications", IEEE Journal of Solid-State Circuits, vol. 29, No. 6, Jun. 1994, pp. 715-722.

Boemo et al., "The Wave Pipeline Effect on LUT-based FPGA Architectures", Ciudad Universitaria, Madrid, Spain, 1996.

Heshami, "A 250-MHz Skewed—Clock Pipelined Data Buffer" IEEE Journal of Solid-Stated Crcuits, vol. 31, No. 3, Mar. 1996, pp. 376 to 383.

Chappell et al., "A 2-ns Cycle, 3.8-ns Access 512-kb CMOS ECL RAM with a Fully Pipelined Architecture", IEEE Journal of Solid-state Circuits, vol. 26, No. 11, Nov. 1991, pp. 1577 to 1583.

Takai et al., "250 Mbyte/s Synchronous DRAM Using a 3-stage-Pipelined Architecture",IEEE Journal of Solid-State Circuits, vol. 29, No. 4, Apr. 1994, pp. 426 to 431.

* cited by examiner (a)

(b)

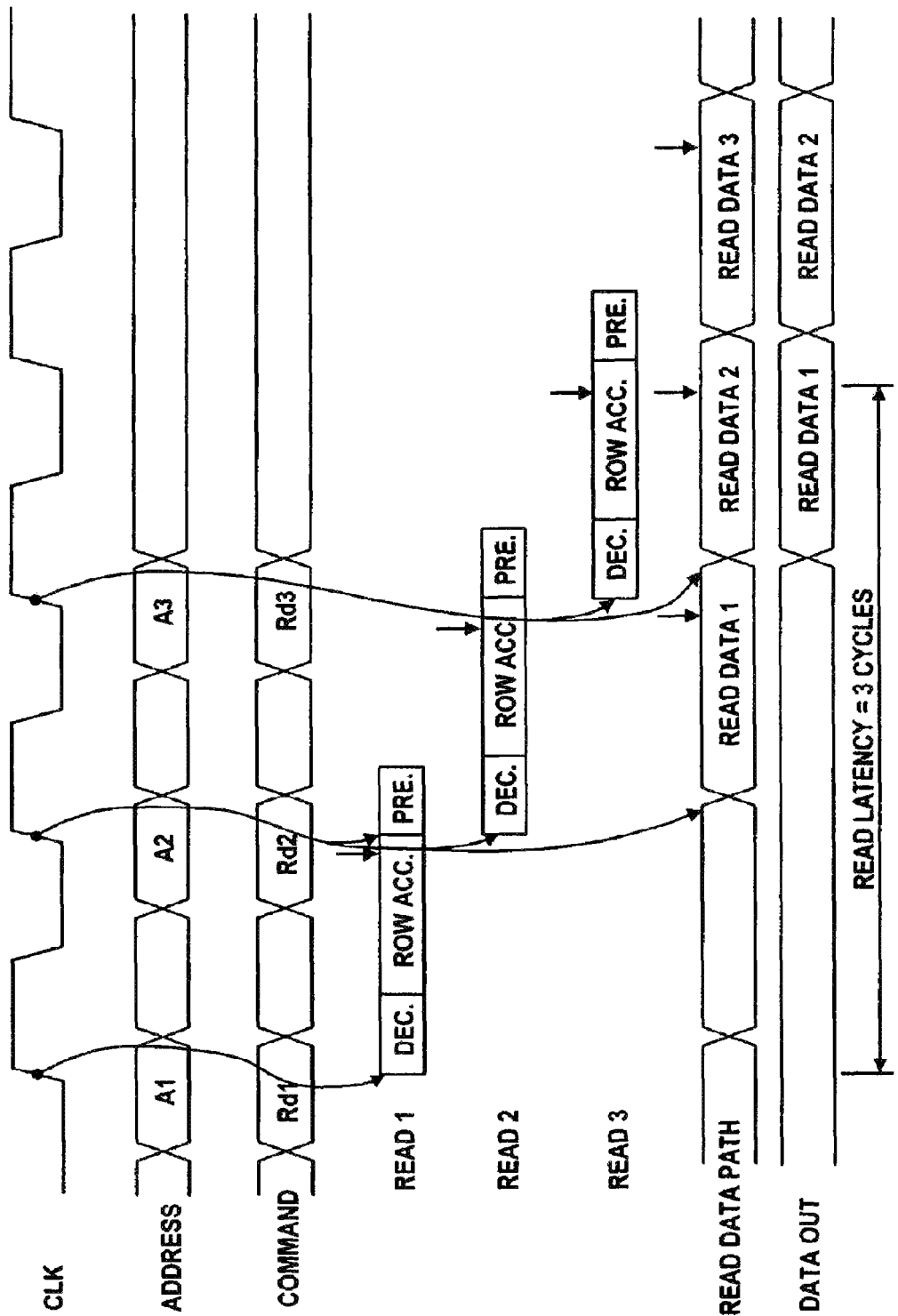

US 7,751,262 B2

HIGH SPEED DRAM ARCHITECTURE WITH UNIFORM ACCESS LATENCY

CROSS REFERENCE TO RELATED APPLICATIONS

This application is a continuation application of U.S. application Ser. No. 11/367,589 filed Mar. 6, 2006, which is a continuation application from U.S. application Ser. No. 11/101,413 filed on Apr. 8, 2005, which is a continuation application from U.S. application Ser. No. 10/804,182 filed Mar. 19, 2004, now U.S. Pat. No. 6,891,772 which is a continuation application from U.S. application Ser. No. 10/336,850, filed Jan. 6, 2003, now U.S. Pat. No. 6,711,083, which is a continuation application from PCT International Application No. PCT/CA01/00949, filed Jun. 29, 2001, which claims priority from Canadian Application Serial No. 2,313,954, filed Jul. 7, 2000 and U.S. Application Ser. No. 60/216,679, filed Jul. 7, 2000.

FIELD OF THE INVENTION

The present invention relates generally to high-speed DRAM architectures, and specifically to timing of read, write and refresh operations.

BACKGROUND OF THE INVENTION

Traditionally, the design of commodity Dynamic Random Access Memory (DRAM) devices has been more focused on achieving low cost-per-bit through high aggregate bit density than on achieving higher memory performance. The reason for this is the cell capacity of a two dimensional memory array increases quadratically with scaling, while the overhead area of bit line sense amplifiers, word line drivers, and row address (or x-address) and column address (or y-address) decoders increase linearly with scaling. Therefore, the design emphasis on memory density has resulted in commodity DRAMs being designed having sub-arrays as large as practically possible, despite its strongly deleterious effect on the time needed to perform cell readout, bit line sensing, cell restoration and bit line equalization and precharge. As a result, the relatively low performance of traditional DRAM architectures as compared to Static Random Access Memory (SRAM) has generally limited its use to large capacity, high density, cost sensitive applications where performance is secondary.

Furthermore, traditional DRAM architectures minimize the number of signal pins on memory devices by multiplexing address lines located between the row and column components of the address. As a result, the two dimensional nature of DRAM array organization has always been an inherent part of the interface between memory control or logic and DRAM memory devices.

The advent of synchronous interface DRAM technologies such as SDRAM, direct RAMBUS, and double data rate (DDR) SDRAM has replaced the separate row and column control signals of asynchronous interface DRAM technologies, such as fast page mode (FPM) and extended data output (EDO), with encoded commands. However, the traditional two-dimensional logical addressing organization of previous architectures has been retained.

An early attempt at increasing DRAM performance by minimizing the latency and cycle time impact of slow row access operations due to the use of large cell arrays led to the creation of two different classes of memory operations, both of which are well-known in the industry. A first class comprises bank accesses. A bank access consists of a row open command followed by a column access. Referring to FIG. 1a, a timing diagram for a bank access is illustrated. A second class comprises page accesses. A page access consists of a column access to a row left open by a previous row open or bank access command. As a result, page accesses are typically faster than bank accesses. Referring to FIG. 1b, a timing diagram for a page access is illustrated. The efficacy of page accesses in reducing average latency is due to the statistical spatial locality in the memory access patterns of many computing and communication applications. That is, there is a strong probability that consecutive memory accesses will target the same row.

A further refinement of such a dual memory access class scheme is the creation of DRAM architectures that explicitly divide each memory device into two or more equal size regions referred to as banks. The intention of this architectural enhancement is to partially reduce the overhead of row accesses by allowing the overlap of memory accesses to one bank, while the other bank is engaged in a row open or close operation. A system implementing a multi-bank architecture is well-known in the industry and is illustrated generally in FIG. 2a by the numeral 200. A timing diagram for such a system is illustrated in FIG. 2b.

A fundamental problem with all of these schemes is the retention of the system of two classes of memory accesses to partially compensate for the slow row access associated with large DRAM arrays. Many real time applications, such as digital signal processors, are limited by worst-case memory performance. These systems cannot tolerate differences in memory access timing as a function of the particular address patterns of consecutive accesses. Even performance optimized embedded DRAM macro block designs strongly tend to retain the dual access class paradigm of commodity DRAM architectures.

Referring to FIG. 3a, an additional attempt at increasing the performance of DRAM with the use of a dual-port architecture is illustrated generally by numeral 300. The dual ported architecture is a more recent advancement in DRAM architecture for achieving higher performance. Each memory cell MC is connected to two bit lines, BL1 and BL2, through access transistors N1 and N2 respectively. This cell architecture allows simultaneous access of memory cell MC through one access transistor and its associated bit line, for example N1 and BL1, while BL2, associated with the other access transistor N2, undergoes precharge and equalization. As a result, a second access can occur via N2 without any delay to precharge bit line BL2.

By alternating back and forth between the two access transistors and their respective bit lines, this architecture can completely hide the overhead associated with closing rows and precharging and equalizing the bit lines. However, the main drawback of this scheme is the greatly reduced bit density within the DRAM array due to the doubling of the number of access transistors and bit lines per memory cell as compared to conventional DRAM designs. Furthermore, such a system also uses an open bit line architecture which is undesirable due to its susceptibility to unmatched noise coupling to bit line pairs.

It is an object of the present invention to obviate and mitigate the above mentioned disadvantages.

SUMMARY OF THE INVENTION

In accordance with an aspect of the present invention there is provided a method for accessing a dynamic random access memory (DRAM) having a plurality of memory storage elements located in rows and columns. A first memory access is initiated by providing a first address signal indicative of the location of at least one memory storage element to be accessed. The first address signal is decoded to select a row and at least one column corresponding to the location of the at least one memory storage element. A word line corresponding to the selected row is enabled and a sense amplifier activated to latch data to or from the at least one selected column. The word line corresponding to the selected row is then disabled and the at least one selected column is precharged. A second memory access is initiated by providing a second address signal indicative of the location of at least one memory storage element to be accessed The second address signal is decoded to select a row and at least one column corresponding to the location of the at least one memory storage element, the second memory access commencing before the step of precharging the selected column has completed.

BRIEF DESCRIPTION OF THE DRAWINGS

Embodiments of the present invention will now be described by way of example only with reference to the following drawing in which:

FIG. 2a is a simplified block diagram illustrating a multi-bank memory architecture (prior art);

FIG. 2b is a timing diagram for the system illustrated in FIG. 2a;

FIG. 3a is a schematic diagram of a dual-port memory architecture (prior art);

FIG. 3b is a timing diagram illustrating read and write operations for the dual-port architecture illustrated in FIG. 3a;

FIG. 13b is a timing and pipeline flow diagram for an embodiment that requires one clock cycle for sub-array access and has a three clock cycle latency.

DETAILED DESCRIPTION

A DRAM architecture is optimized for high speed performance regardless of the address pattern of consecutive memory access operations. Every read, write or refresh operation has the same timing. This differs from traditional DRAM architectures in which operation timing depends on the value of the target address as well as the history of previous memory operations.

Achieving the same access timing for all memory commands is accomplished by performing a complete row access operation for every read, write and refresh command received. The complete row access operation includes word line assertion, memory cell readout, bit line sensing, cell content restoration, word line deassertion, and bit line equalization and precharge. The following description illustrates the implementation details that permit memory devices or memory macro blocks fabricated using conventional DRAM process technology to perform data accesses with latency and cycle times similar to page accesses performed by conventionally architected DRAMs. However, the present architecture is not dependent on the pattern in which the memory is accessed.

The key implementation details of the present embodiment of the invention include, but are not limited to, physical organization, operation sequencing and overlap, signal levels, clocking, and timing generation techniques. The present embodiment describes an implementation that performs an entire DRAM array access within one period of a synchronous interface clock signal and can accept a new command every clock period. However, a person skilled in the art will appreciate that other relationships between memory operations and interface clock timing are possible. Furthermore, under certain circumstances, other timing relationships may even be desirable, without departing from the scope of the present invention.

Figure 5:
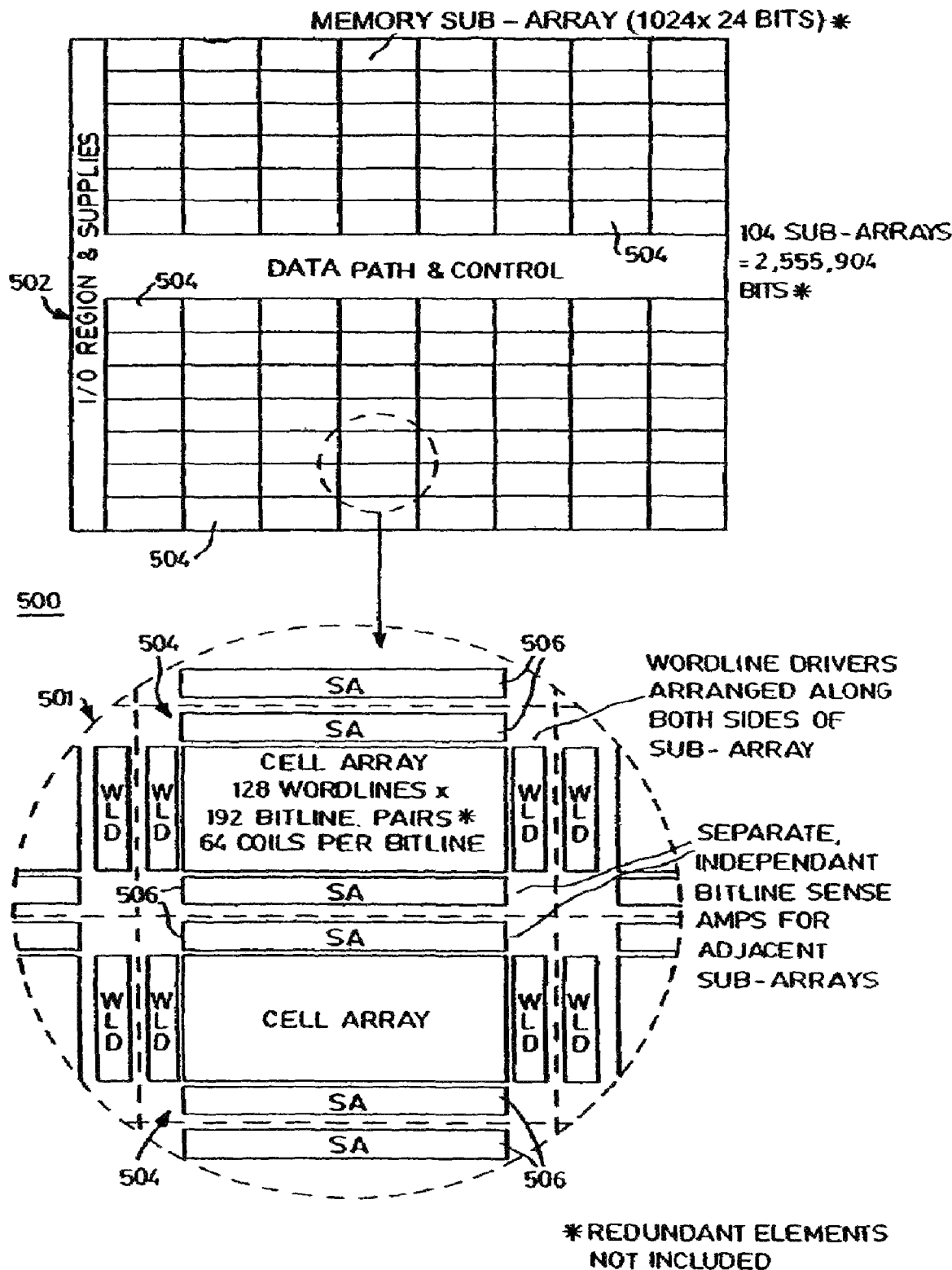
FIG. 5 is a block diagram of a general memory architecture in accordance with an embodiment of the present invention.

Referring to FIG. 5, the general architecture of a memory according to an embodiment of the invention is illustrated generally by numeral 500. A magnified portion of one of the areas in the memory 500 is illustrated generally by numeral 501. A DRAM device or memory macro block 502 comprises a plurality of equally sized, relatively small rectangular DRAM sub-arrays 504 built with a folded bit line architecture. To limit the delay introduced by bit line isolation devices, adjacent sub-arrays 504 do not share sense amplifier devices. Rather, adjacent subarrays 504 have separate, dedicated sense amplifiers 506.

Additionally, in the present embodiment the sub-array 504 is organized with approximately one quarter the number of physical memory cells per bit line than would conventionally be designed for a DRAM in the same process technology. The use of fewer physical memory cells per bit line reduces bit line capacitance, which, in turn, reduces the ratio of bit line capacitance to memory cell capacitance. The voltage differential on a bit line is given by the expression:

$$\Delta V_{BL} = (V_{CELL} - V_{BL}) * C_{CELL} / (C_{BL} + C_{CELL}).$$

Therefore, if the bit line capacitance $C_{BL}$ is decreased, then $V_{CELL}$ can also be attenuated while still achieving the same bit line voltage differential $\Delta V_{BL}$. This ratio reduction permits memory cells storing attenuated charge levels to more rapidly achieve bit line voltage differentials similar to those of conventionally designed DRAMS, as will be described in detail below. This further permits memory cell restoration or a write portion of a row access to be terminated prior to the cell reaching a full voltage level of VDD or VSS under slow conditions (high temperature, low voltage, slow process) while achieving robust read sensing with standard sense amplifier circuit designs.

Figure 1:
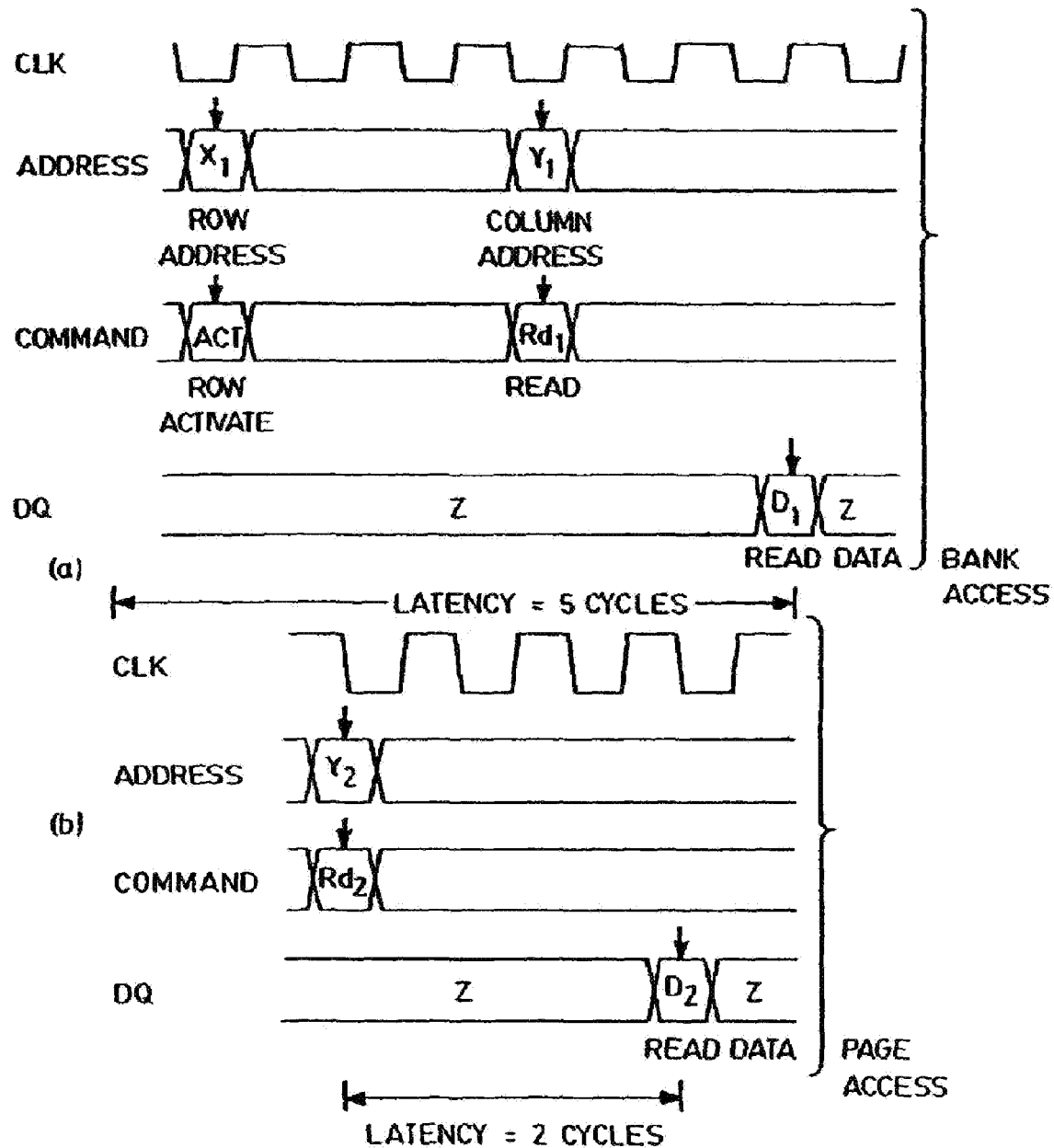
FIG. 1a is a timing diagram for a memory bank access.
FIG. 1b is a timing diagram for a memory page access.
Figure 2:
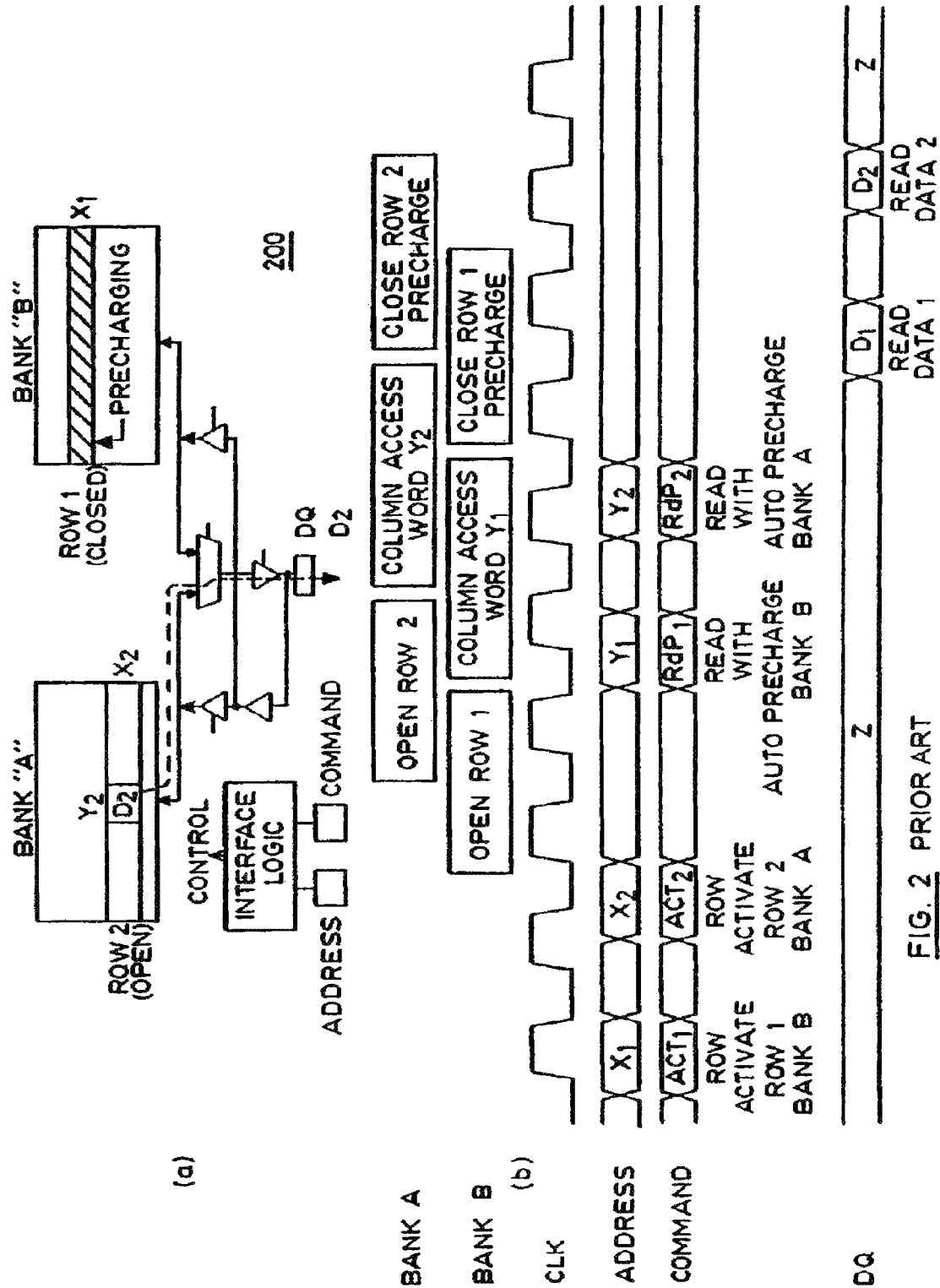
Figure 3:
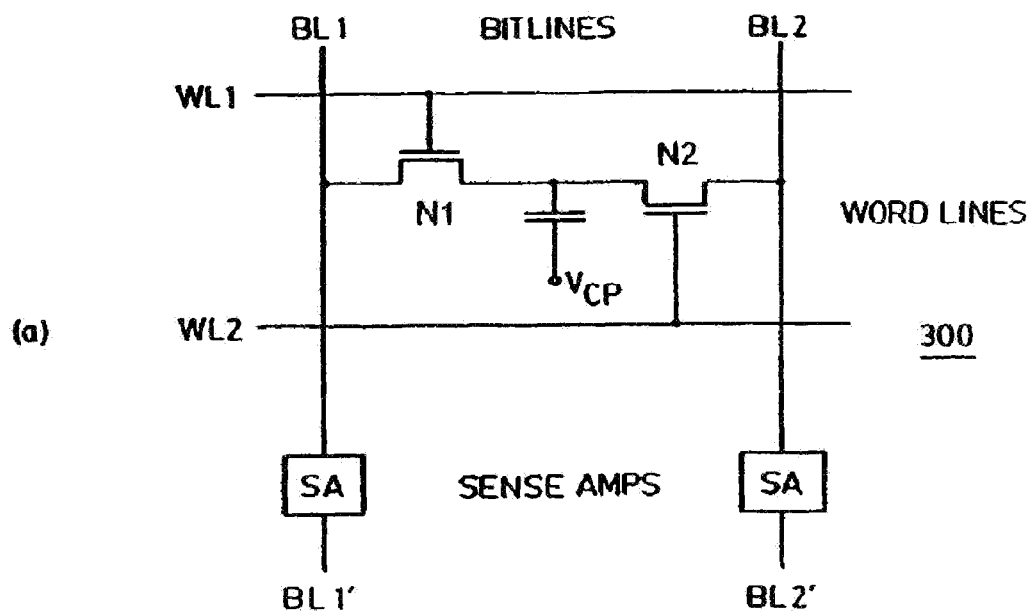
Figure 3:
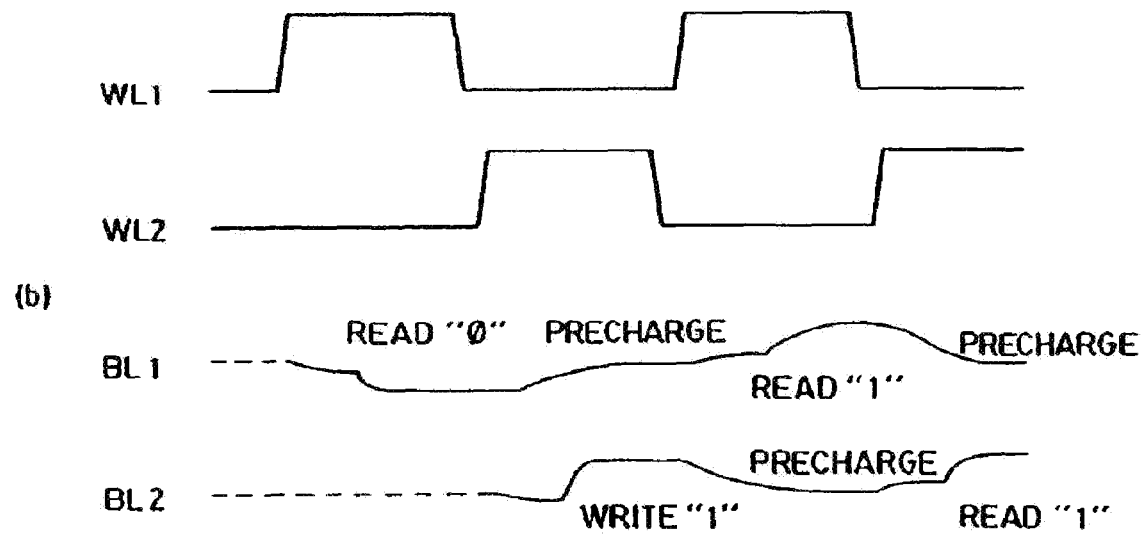
Figure 4:
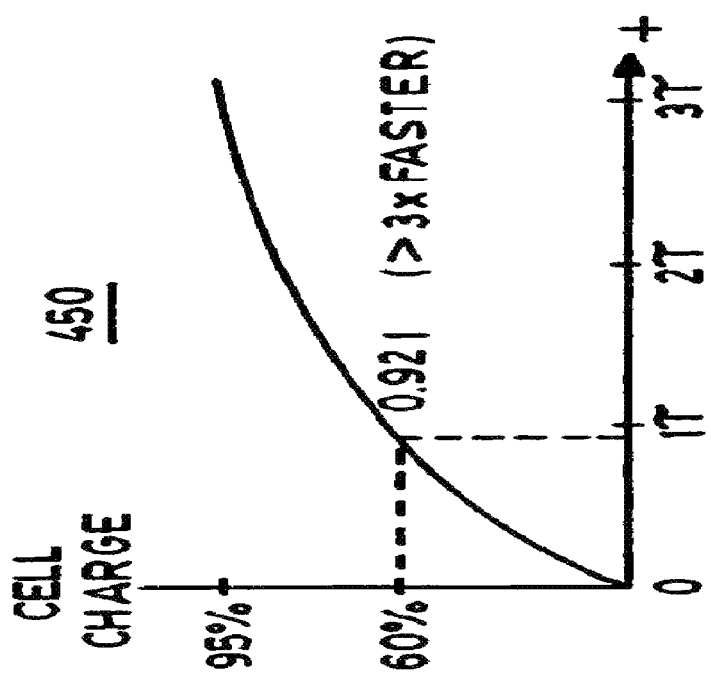
FIG. 4 is a graph comparing a conventional DRAM cell (prior art) with a DRAM cell in accordance with an embodiment of the present invention.
Figure 4:
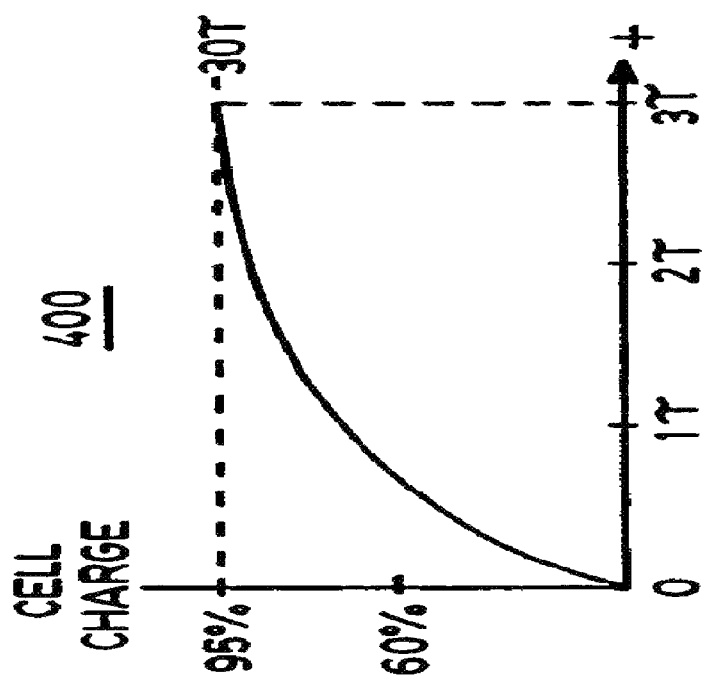

Referring to FIGS. 4a and 4b, graphs illustrating the time required to charge a conventional DRAM cell and a DRAM cell in accordance with the invention are illustrated generally by numerals 400 and 450 respectively. For the purpose of this example, the conventional DRAM has 256 cells per bit line segment. For precharge voltage $V_{BLP}$ of $V_{DD}/2$ with a 95% charge level as a worst case scenario, the cell voltage is approximately 0.025 VDD for a storing logic "0". For storing a logic "1", the cell voltage is approximately 0.975 VDD. Alternately, using partial charge storage levels in accordance with the invention allows for a worst case scenario of 60%, yielding a voltage of 0.20 VDD for storing a logic "0", and 0.80 VDD for a storing logic "1". Therefore, for a cell restoration or write, using 60% of the charge level as an acceptable charge storage level, only one time constant τ is necessary to reach the required level vs. approximately 3 time constants 3τ required for conventional DRAM.

The number of bit line pairs per array is limited in order to achieve very rapid signal propagation across the sub-array for a given word line, thereby limiting timing skew. In order to compensate for this relatively small number of bit lines per array, the architecture can use relatively wide sub-arrays if the word lines are appropriately strapped with metal interconnect at sufficiently close intervals. This limits the word line propagation delay introduced by RC parasitics. Although not specifically shown in FIG. 5 for simplicity, the word lines and bit line pairs are interleaved. That is, the word lines are driven by word line drivers on alternate sides of a sub-array and the bit lines are connected to sense amplifier and equalization circuitry on alternate sides of the sub-array.

Figure 6:
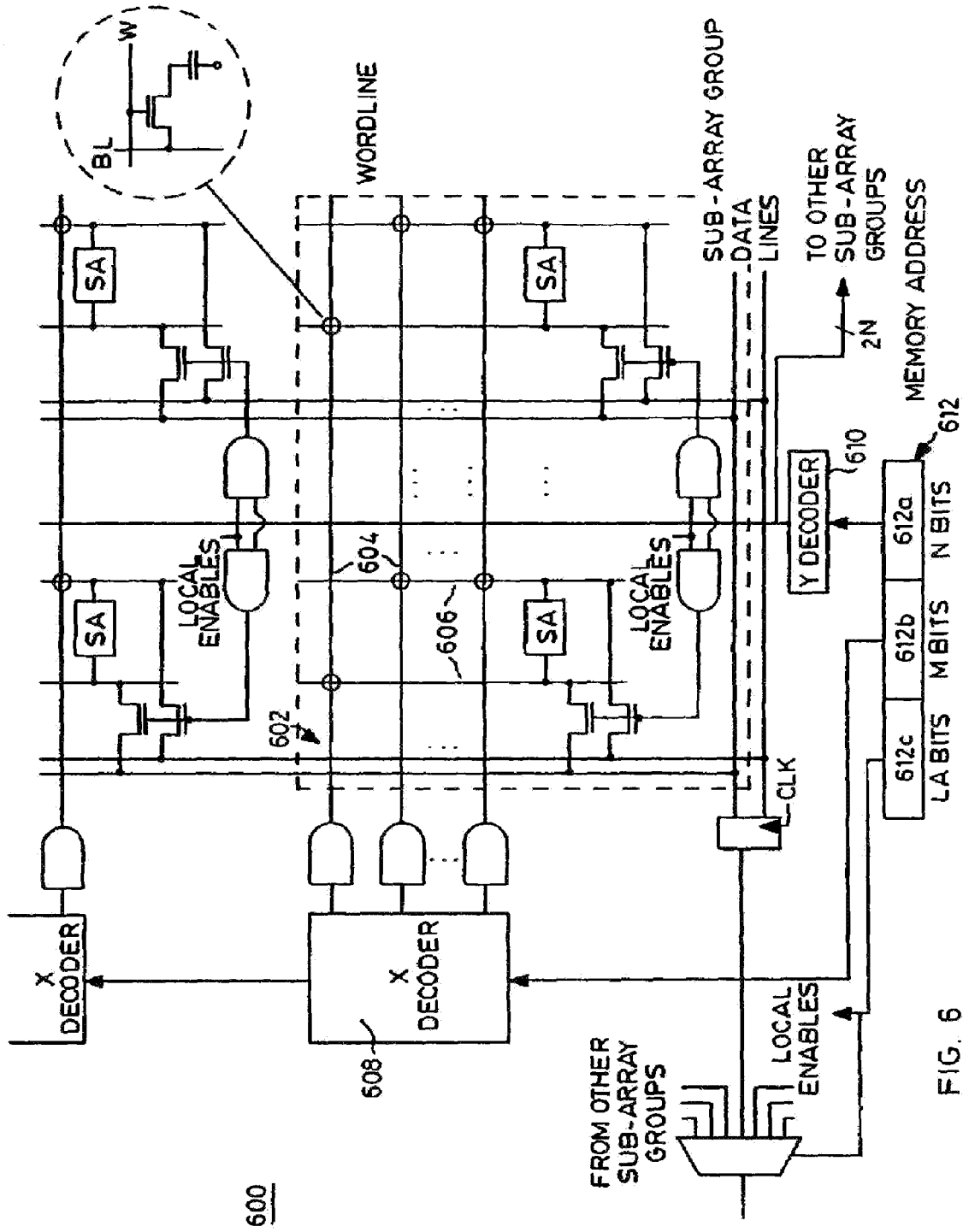
FIG. 6 is a conceptual schematic illustrating the memory address fields and their coverage.

Referring to FIG. 6, a memory address field and its mapping are illustrated generally by numeral 600. Each sub-array 602 comprises an array of word lines 604 and bit line pairs 606. A row (or X) decoder 608 selects the word lines and a column (or Y) decoder 610 selects the bit line pairs. The column (or Y) decoder 610 decodes the N least significant bits of a memory address 612 to select a column address. The row (or X) decoder decodes the M next most significant bits of the memory address 612 to select a row address. The LA most significant bits of the memory address 612 are used for generating local enable signals for appropriate sub-array selection.

A first segment 612a of the memory address 612 comprises the N least significant bits for addressing an individual word within a row. Therefore, there are $2^N$ words contained in each word line. The length of a word is denoted as W. Therefore, each word line controls access to $W*2^N$ bits in each row. For a refresh operation an entire row is selected, so the N least significant bits are essentially ignored or treated as "don't cares" for this command.

A second segment 612b of the memory address 612 comprises the next M more significant bits for addressing a word line within a sub-array. The number of word lines per sub-array is $2^M$. According to one embodiment of the invention, M=7 and therefore each sub-array has 128 word lines, not including redundant row elements (not shown).

A third segment 612c of the memory address 612 comprises the LA most significant bits, which are used to address a particular sub-array within the memory. A complete memory device or macro block consists of A sub-arrays. LA is the smallest integer such that $2^{LA}$ is greater than or equal to A. Therefore, the total capacity of the memory is $(W*2^N)*(2^M)*A=A*W*2^{(M+N)}$ bits. Furthermore, the memory interface uses an address size of LA+M+N bits. According to one embodiment of the invention, N=3, M=7, A=104, LA=7, and W=24. Therefore, 17 address bits are used for identifying one out of 106, 496 24-bit words and the memory has a total capacity of 2,555,904 bits.

The default quiescent state for all DRAM sub-arrays is all word lines kept at logic low and all bit lines and data lines equalized and precharged at a predetermined precharge voltage level. Read, write and refresh operations affect only the sub-array addressed by the LA most significant bits 612c within the memory address 612. The A sub-arrays within a memory device or macro block are addressed by the values 0, 1, . . . A−1. Only the addressed sub-array is accessed during an operation. All other sub-arrays remain in the default quiescent state. Read, write and refresh commands cause a row operation within the addressed sub-array using the word line selected by the value of the M bits in the middle segment 612b of the memory address 612. Read and write operations access the word selected by the N least significant bits 612a of the memory address 612.

Figure 7:
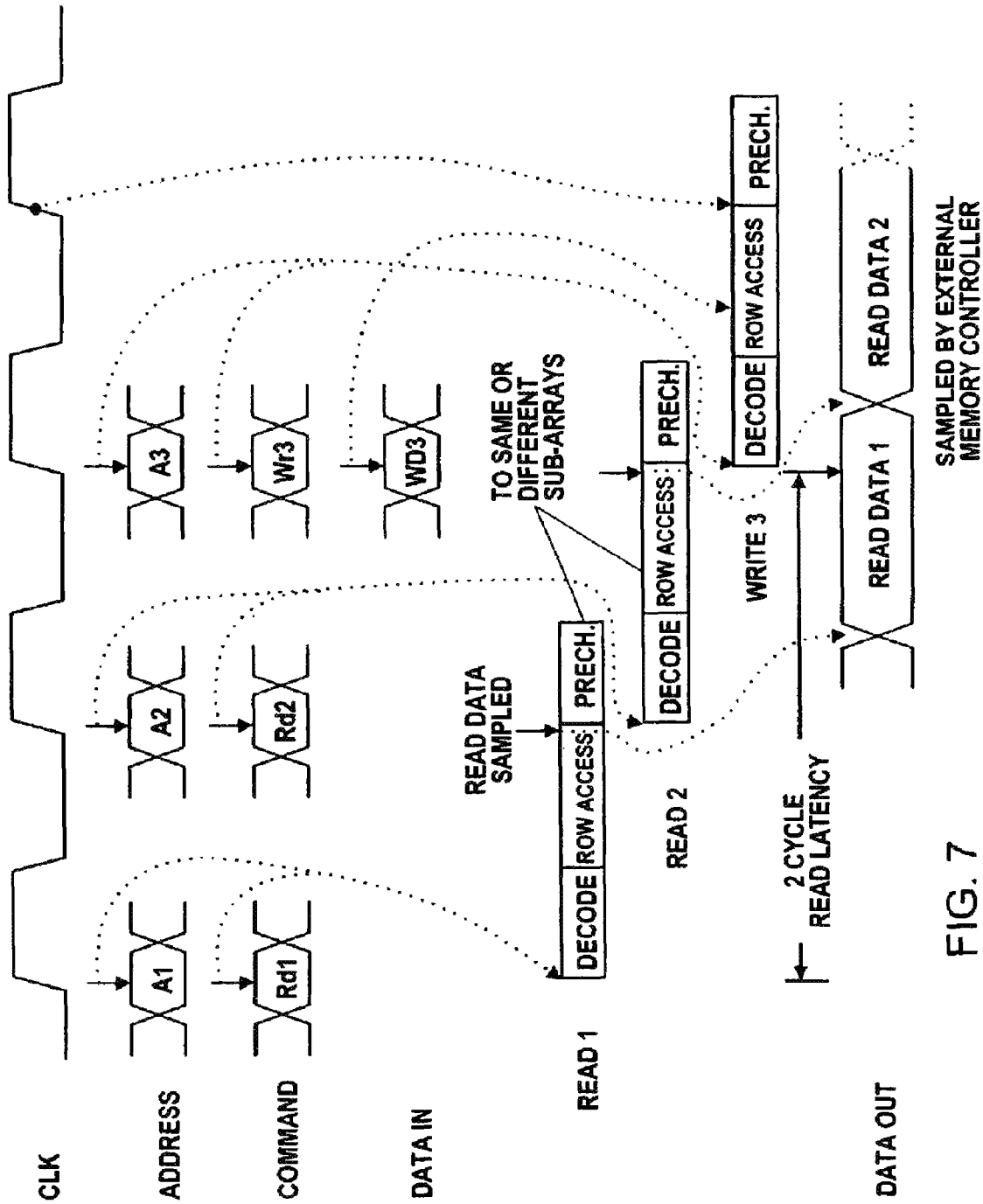
FIG. 7 is a timing and pipeline flow diagram illustrating the operation of the architecture illustrated in FIG. 6.

Referring to FIG. 7, a timing and pipeline flow diagram illustrating the general operation of two read commands and one write command for the above-described implementation of the memory architecture is shown. In this particular implementation, the command, address, and write data inputs are sampled on the rising edge of a synchronous interface clock CLK and new commands can be issued on every consecutive clock rising edge. A first read command RD1 initiates a read READ1 on address A1 on a first rising edge of the clock CLK. Similarly, on a second and subsequent clock rising edge, a second read command RD2 initiates a read READ2 on address A2. Subsequently, a write command WR3 initiates a write WRITE3 for writing the data WD3 present at the data input to the memory cell at address A3 on a third and subsequent clock rising edge. Data READ DATA 1 and READ DATA 2 accessed by the read commands are output to a data output line after a two-cycle read latency.

As can be seen from FIG. 7, in accordance with one embodiment of the invention, a complete row access operation is performed in response to each command sampled. Although the row access operation takes longer than a single system clock period, the commands can be input on every rising edge of the clock by being overlapped. For example, the word line deassertion and bit line equalization and precharge of command READ 1 is overlapped with the address and command decoding, row redundancy address comparison, and signal propagation of command READ2, when the two commands are issued back to back on consecutive clock cycles. Similarly, the precharge portion of the READ 2 command operates concurrently with the decode portion of the write 3 command.

Each of the precharge and equalization operations are shown at the end of the operation for illustrating that it can overlap the setup for another command. The precharge and equalize operation is shown conceptually tacked on to the previous read operation because logically, the precharge and equalize function is the final operation of the previous command required to bring the subarray back into a stand-by state. However, in the actual implementation, the rising clock edge is synchronized with the appropriate precharge and equalize step for that particular command. For example in FIG. 7, the READ2 command is sampled on the second clock edge and its associated precharge and equalize is also sampled at this same time, i.e. at the beginning of the second clock cycle.

Figure 8:
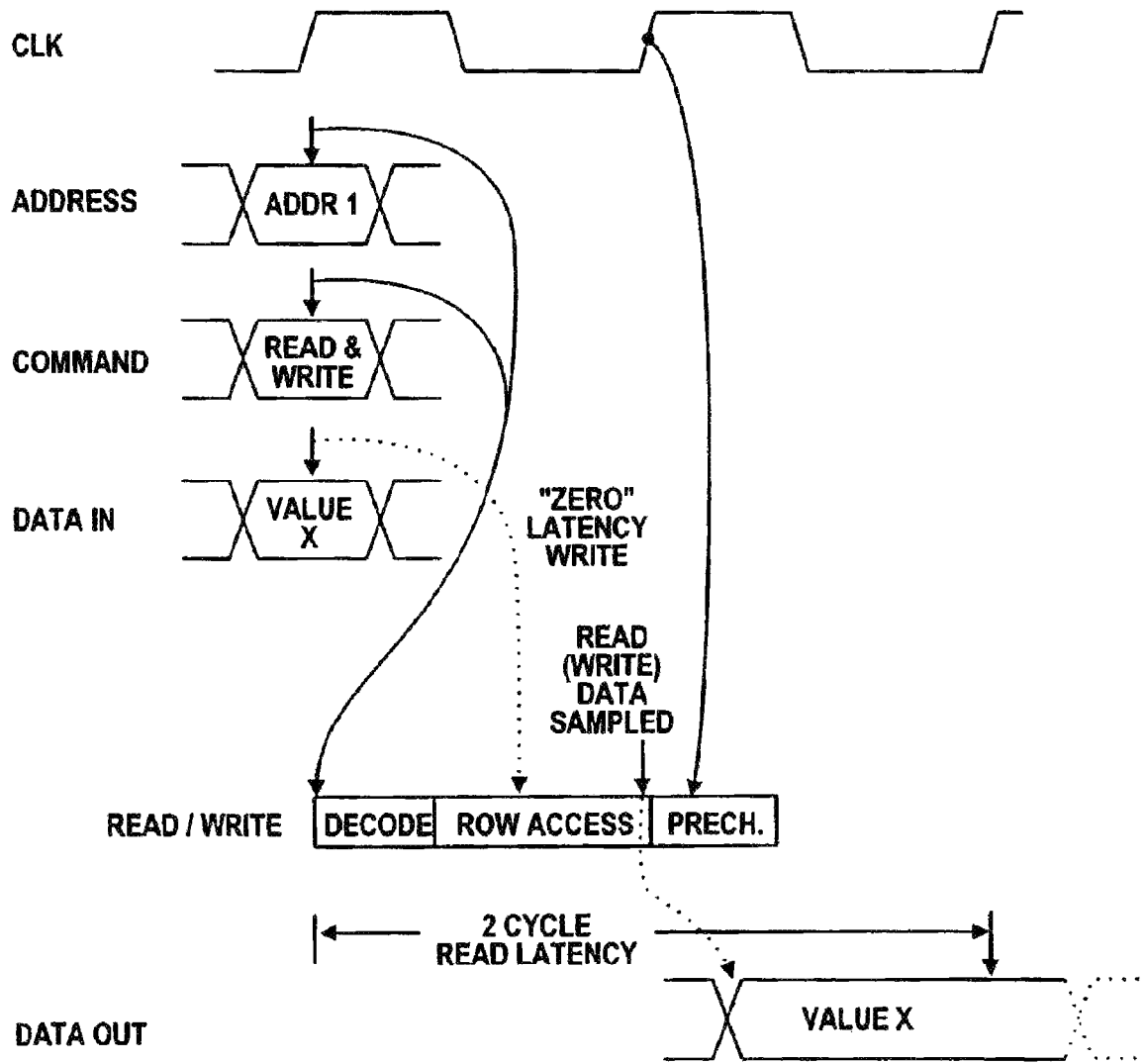
FIG. 8 is a timing and pipeline flow diagram illustrating the ability of the circuit illustrated in FIG. 6 to both read and write on a single command.

Referring to FIG. 8, a timing and pipeline flow diagram illustrating the capability of supporting simultaneous read and write operations to the same address within one system clock cycle is represented generally by numeral 800. A simultaneous read and write operation is useful in some data processing applications as it allows data to be stored in memory to be forwarded to a subsequent load from the same address. Typically, the prior art requires a separate, external bypass path from the memory data in and data out pins or pads. On the rising edge of the clock signal CLK, data VALUE X presented at a data input is written to a selected address ADDR1. Towards the end of the time allotted for a row access, the data VALUE X written to the address ADDR1 is sampled and presented at a data output. The data VALUE X is available at the data output after a two-cycle latency, the same latency as for the read, write, and refresh operations.

Figure 9A:
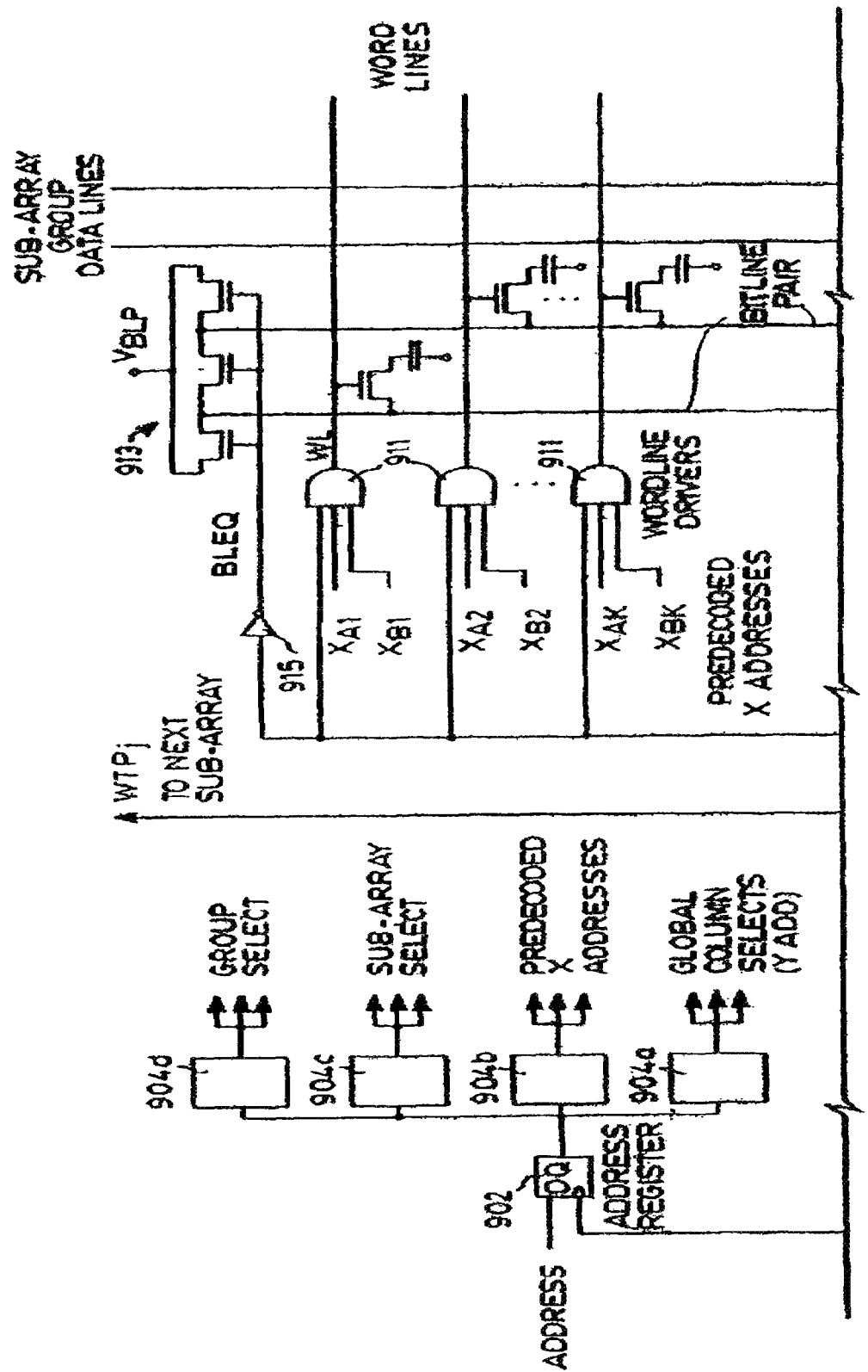
FIG. 9 is a functional block diagram illustrating the memory architecture illustrated in FIG. 6.
Figure 9B:
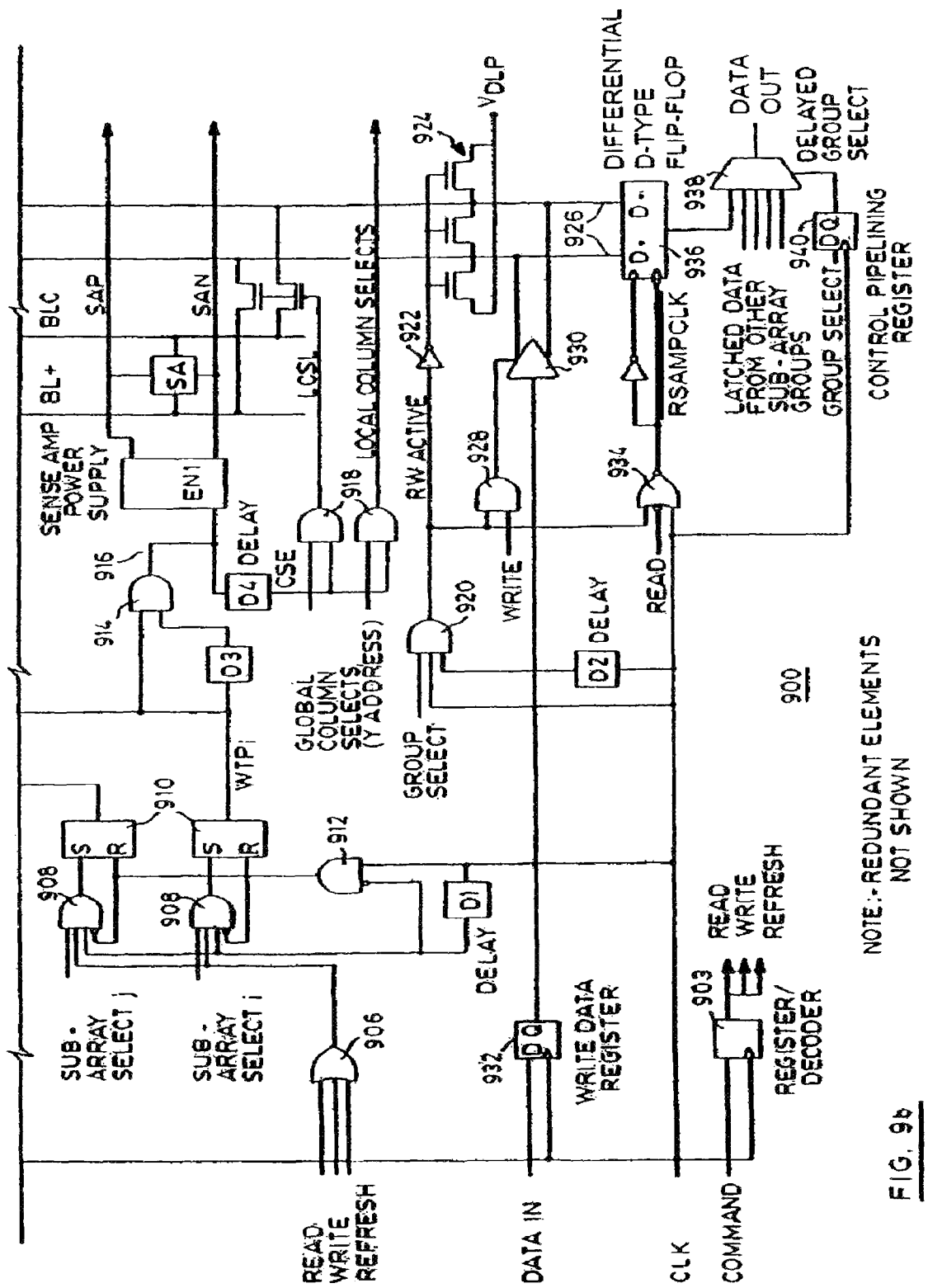

Referring to FIGS. 9a and 9b, control circuit elements and data path elements for a sub-array according to one embodiment of the invention are illustrated generally by numeral 900. The general timing of operations on a selected sub-array is based on a single master timing reference signal, referred to as a word line timing pulse ($WTP_i$). A target address is input to an address register 902. An operation command is input to a register/decoder 903. Both the address register 902 and the register/decoder 903 are clocked by the synchronous interface clock signal CLK. The register/decoder 903 generates an internal READ, WRITE, or REFRESH command signal depending on the external command received.

The output of the address register 902 is sent to a plurality of address decoders 904. A first decoder 904a decodes the N least significant bits of the input address for generating a global column select signal or Y-address. A second decoder 904b decodes the M next significant bits for generating a predecoded X-address. A third decoder 904c decodes the LA most significant bits of the memory address for generating a sub-array select signal. The sub-array select signal enables one of the plurality of sub-arrays in the memory device or macro block. A fourth decoder 904d decodes a sub-array group. Within the memory there are groups of sub-arrays. A sub-array group shares the same data lines, read data register/multiplexer and write buffer, which will be discussed in more detail below. The LA most significant bits of the address select a group of sub-arrays and a sub-array within that group.

The read, write, and refresh signals are combined by OR-gate 906. The output of OR-gate 906 is input to a plurality of AND-gates 908 for generating the word line timing pulse $WTP_i$. The word line timing pulse $WTP_i$ is generated locally for each sub-array. Therefore, the AND-gate 908 has the sub-array select signal as a further input and the output of the AND-gate 908 can only be asserted if the associated sub-array is selected by the sub-array select signal. Another input to the AND-gate 908 is the clock signal CLK delayed by delay D1.

The output of the AND-gate 908 is an S-input to an SR flip-flop 910. An R-input to the SR flip-flop 910 is generated by combining the clock signal CLK with the inverse of the clock signal CLK delayed by delay D1 via an AND-gate 912. The inverse of the signal provided at the R input of the SR flip-flop 910 is also used as an additional input to the AND-gate 908 for ensuring that the S and R inputs of the SR flip-flop are never both equal to one. The output of the SR flip-flop 910 is the word line timing pulse $WTP_i$ for the $i^{th}$ sub-array. The word line timing pulse $WTP_i$ is logically combined with the predecoded X addresses from predecoder 904b via a plurality of AND-gates 911. The output of AND-gates 911 is a word line enable signal WL for enabling the selected word line. The word line timing pulse $WTP_i$ is further coupled to a bit line equalization circuit 913 via an inverter 915 for equalizing and precharging the bit-line pairs to a bit line precharge voltage $V_{BLP}$ when the $WTP_i$ is low. The inverted signal is referred to as bit line equalization signal BLEQ.

The word line timing pulse $WTP_i$ is further combined with a delayed version of itself via AND-gate 914 for providing a sense amplifier power supply enable signal 916. The sense amplifier power supply enable signal 916 powers sense amplifiers SAP for providing power to the PMOS devices of bit-line sense amplifiers and SAN for providing power to the NMOS devices of bit-line sense amplifiers. The word line timing pulse $WTP_i$ is delayed by delay element D3. The sense amplifier enable signal 916 enables the sense amplifier power supply for powering the sense amplifiers across the bit line pairs for the selected sub-array.

The sense amplifier power supply enable signal 916 is further delayed by delay element D4 for generating a column select enable signal CSE. The column select enable signal CSE is combined with the global column select address signals from column decoder 904a via an AND-gate 918 associated with that particular sub-array. The output of AND-gate 918 provides a local column select signal LCSL. The local column select signal LCSL enables the appropriate bit line pair via a column access device for either a read, write or refresh operation.

An AND-gate 920 combines the group select signal, the clock signal CLK, and the clock signal delayed by delay D2. The output of AND-gate 920 is a read-write active signal RWACTIVE. Signal RWACTIVE is inverted by inverter 922 for gating serially coupled data line precharge and equalize transistors 924 for precharging a pair of data lines 926 to a data line precharge voltage $V_{DLP}$ when the sub-array is not selected.

The RWACTIVE signal is also combined with the WRITE signal by AND-gate 928. The output of AND-gate 928 enables a write buffer 930 for driving received input data onto the pair of data lines 926. The input to the write buffer 930 is received from a D-type flip-flop 932, which receives external input data as its input and is clocked by the clock signal CLK. The RWACTIVE signal is further combined with the inverse of the read signal and the clock signal CLK via a NOR-gate 934. The output of NOR-gate 934 is a read sample clock signal RSAMPCLK for enabling a differential D type flip-flop 936 for reading data present on the pair of data lines 926. The output of the differential D type flip-flop 936 is coupled to a word-size multiplexer 938. The multiplexer 938 is shown in a conceptual format, but in a physical implementation, it is constructed using a distributed multiplexer configuration. An enable to the word-size multiplexer 938 is provided from the output of a D flip-flop 940. The input to the D flip-flop 940 is the group select signal, and the D flip-flop 940 is clocked by clock signal CLK.

Figure 10A:
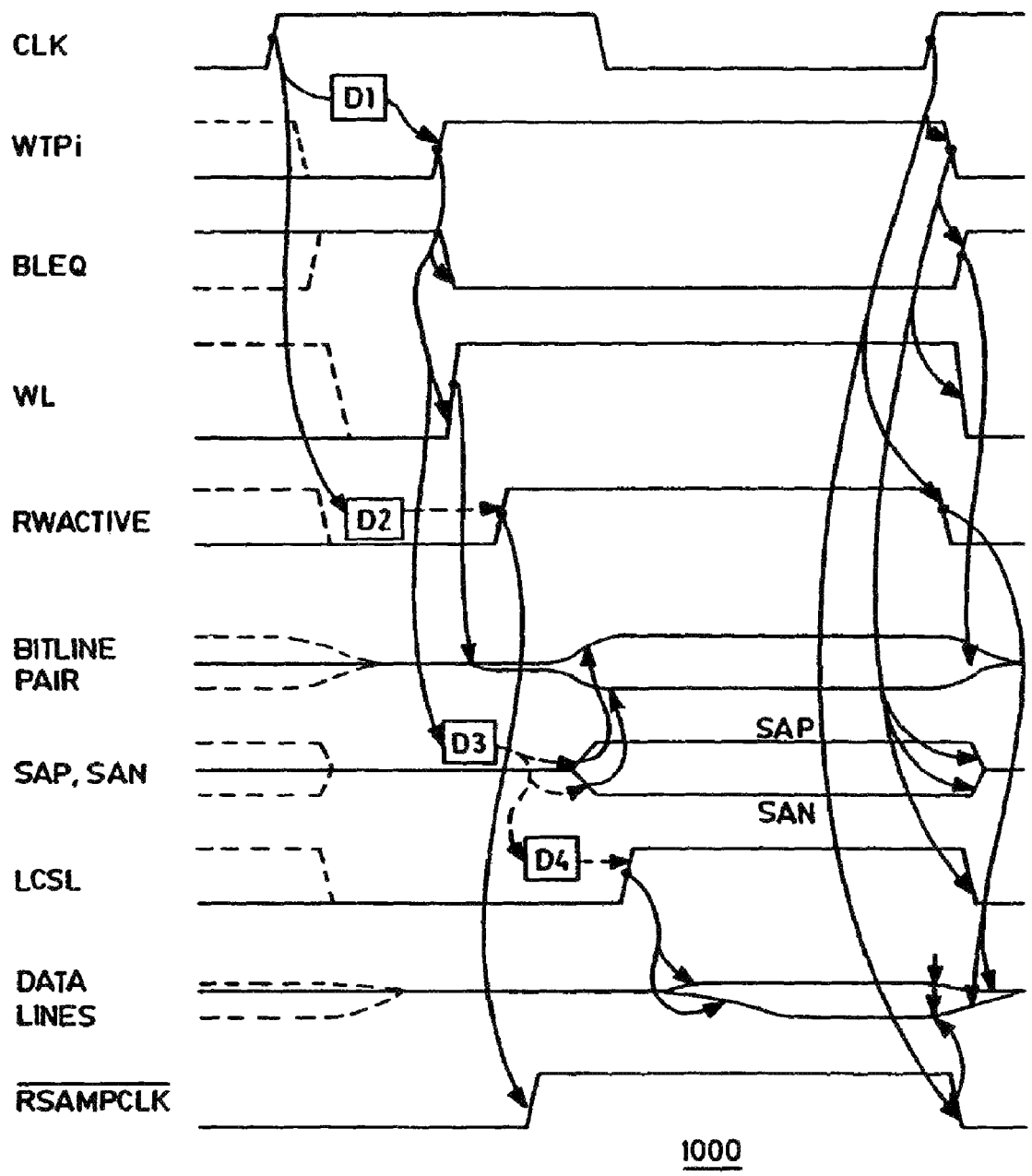
FIG. 10a is a timing diagram illustrating the timing for the functional blocks illustrated in FIG. 9.

Referring to FIG. 10a, a timing diagram for the timing of associated signals in FIG. 9 for a read operation is illustrated generally by numeral 1000. The operation of the circuit is described as follows with reference to both FIGS. 9 and 10. The word line timing pulse $WTP_i$ is held logic low when the memory is idle. When $WTP_i$ is low, all word lines are low and the bit lines and data lines within the sub-array are actively held in an equalized and precharged state. Each sub-array has a dedicated $WTP_i$ signal which is selected through sub-array selection gates 908. The $WTP_i$ signal associated with a selected sub-array is asserted after a fixed delay period from the rising edge of the clock that samples a valid command at the memory interface. $WTP_i$ stays high during the remainder of the clock period until it is unconditionally reset by the next rising edge of the clock. $WTP_i$ acts as a gating signal for the regular and redundant (not shown) word line drivers. As WTP$_i$ rises and falls, the word line within the sub-array selected by the sampled address rises and falls with it. The rising edge of WTP$_i$ also drives self-timed circuitry for enabling the bit line sense amplifiers and local column select access devices.

Referring once again to FIG. 10a, after a programmable preset delay D1, the word line timing pulse WTP$_i$ goes high, causing the bit line equalization signal BLEQ and the word line signal WL to go high. It should be noted that delays D1, D2, D3, D4 are all implemented using a novel delay circuit described in MOSAID co-pending application Ser. No. 09/616,973 and published as international application serial number WO 0203551 A2 (herein incorporated by reference). After a programmable preset delay D2 from the rising edge of the clock signal, the RWACTIVE signal is asserted, causing the signal RSAMPCLK signal to go high. In response to the assertion of the word line signal WL, a voltage differential begins to develop across the bit line pair. After a combined delay D1+D3, the sense amplifier power supply signals SAP, SAN are asserted, thereby amplifying the voltage differential across the bit line pair. After a combined delay D1+D3+D4, the local column select signal LCSL is asserted, thereby selecting a column from which data is to be transferred. In response to the assertion of the local column select signal LCSL, data is transferred from the selected column to an associated pair of data lines.

It is important to note that each of the steps described above were initiated by self-timed signals derived from the master word line timing pulse WTP$_i$ thereby allowing fine-tuning precision of the timing of each signal. It should also be noted that although the above description referred generically to one selected column and associated data line pair, one skilled in the art would appreciate that in fact multiple columns can be selected by a column select signal, each having associated data lines.

For read operations, a delayed version $\overline{\text{RSAMPCLK}}$ of the input clock signal CLK provides complementary sampling inputs to a set of H word-sized differential input D type flip-flops 936, which are also connected to the data lines 926 for a group of one or more sub-arrays. The D type flip-flops are preferably those described in co-pending MOSAID patent application no. PCT/CA00/00879 filed on Jul. 30, 2000 and herein incorporated by reference. On the next rising edge of the clock CLK, $\overline{\text{RSAMPCLK}}$ latches the sampling clock inputs to the read data flip flops 936 which capture the read data at the end of the row access operation. The output of the read data flip-flops 936 for the sub-array group containing the accessed sub-array is routed through a multiplexer network 938 for selecting the final output data from the appropriate sub-array group before being presented to the device pins or macro pins. Employing such a self-referenced timing scheme to control read operations results in read commands that can be issued to the memory on every clock cycle and have an effective latency of two cycles. That is, a read command sampled on a rising clock edge N will present its output data at the interface with sufficient set-up time to allow the memory controller to latch it using rising clock edge N+2.

Write operations also make use of the self-timed circuitry for generating RWACTIVE, which is referenced to a delayed version of the input clock signal CLK as shown in FIG. 9. The self-timed circuitry turns off the data line equalization and precharge circuitry 924 through the logic low output from inverter 922. It enables the write buffer 930 by providing a logic high from the output of AND-gate 928 to drive the write data sampled at the interface to the data lines 926. Column access devices within a sub-array are controlled by local column select signals LCSL generated by AND-gates 918 as previously mentioned.

Precise control of the relative timing between bit line sensing and enabling of the column access devices is important for performing write operations. Typically, once a word line is selected, all memory cells associated with that particular word line will be accessed and the stored data will be transferred via word line access transistors to the respective bit lines. Subsequently, all sense amplifiers associated with the selected sub-array will begin to sense the data on all of their associated bit lines (for ensuring data integrity within unselected bit lines within the row). In conventional DRAMs, for a write operation, once a particular column has been selected, the write drivers will overwrite the bit line sense amplifier sensed data. In accordance with the invention, however, there is a short interval at the beginning of a write operation between when the sense amplifiers begin to increase the bit line voltage split in response to a word line being activated and the bit line split approaching full rail voltage levels. During this interval, a write operation can be performed through precise control of the timing between bit line sense amplifier activation and column access device activation. If the column devices are enabled too late, then a write operation intended to overwrite opposite phase data on the bit lines will take longer because the write drivers have to overcome a full voltage split of opposite phase. If the column access devices are enabled too early, there is a risk of data corruption occurring from noise coupling between the local data bus (which in this embodiment runs parallel to bit lines) and bit lines unselected for the write operation. The unselected lines are performing essentially a sense and restore operation only.

Figure 10B:
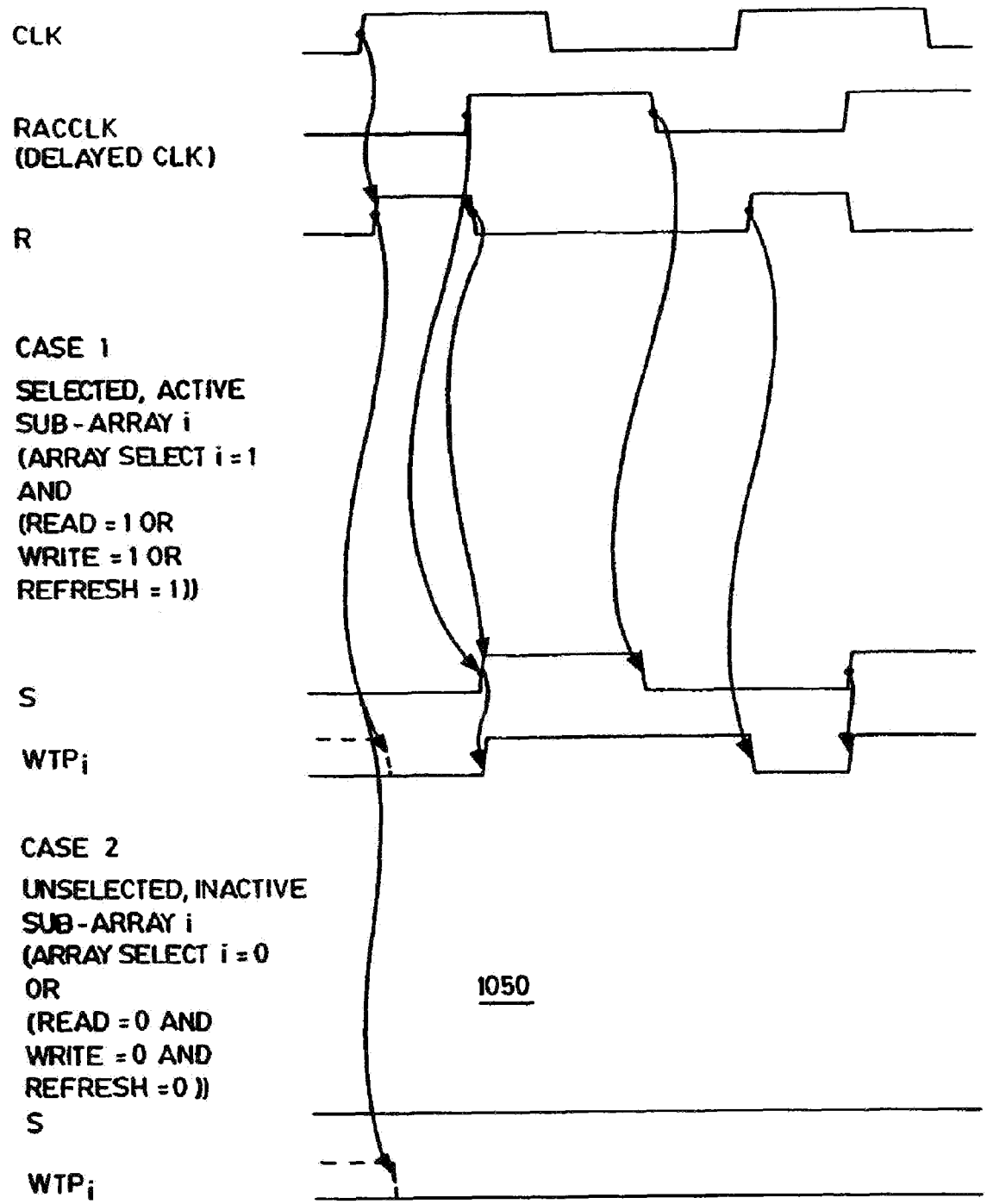
FIG. 10b is a timing diagram illustrating the activation of the word line timing pulse in cases where a sub-array is selected and unselected.

For this reason, the self-timed nature of the present invention allows for a very tight control between the timing of the word line activation, the bit line sense amplifier activation, the write driver activation and the column select activation. Specifically, the WTP$_i$ signal is self-timed from the clock signal CLK, through delay D1, gate 912 and flip/flop 910. The sense amplifiers are then activated based on the self-timed circuit comprising delay D3 and gate 914. The same self-timed signal 916 generated by gate 914 is then used to drive delay D4 and gates 918 which are therefore self-timed from the activation of the sense amplifiers and will be activated precisely at the same time after the bit line sense amplifiers have been activated. Meanwhile, the write drivers 930 are also activated through self-timed circuitry formed by delay D2 and gate 920 and 928. In this manner, write drivers can more rapidly reverse an opposite phase logic state on bit lines to which they are writing to than in conventional DRAM implementations. Referring to FIG. 10b, a timing diagram for generating the WTP$_i$ signal is illustrated generally by numeral 1050. If the sub-array is active, or selected, the S input of the SR flip-flop 910 goes high. Consequently, the WTP$_i$ signal goes high and begins the sequence of control operations required for the command. The WTP$_i$ signal is reset to low at the next rising edge of the clock. This situation is illustrated as case 1. However, if the sub-array is inactive, or unselected, the S input to the SR flip-flop 910 remains low and, therefore, the WTP$_i$ signal remains low. This situation is illustrated as case 2 in FIG. 10b.

Referring back to FIG. 9, in relation to the pipelining of commands and the group select role, if a read operation is performed within a given sub-array group in cycle N, then its group select will be asserted during cycle N. The register 940 latches the group select signal on the rising clock edge that separates clock periods N and N+1. The output of the register 940 controls the selection of the multiplexer 938 during clock period N+1.

Refreshing the memory contents of the device or macro block 502 is controlled by an external memory controller. The external memory controller organizes the refresh pattern and timing in an optimum manner for a particular application. However, each cell should be refreshed at least once in a predefined refresh interval. The refresh interval is dependent on the implementation and technology used.

In order to periodically refresh all the memory cells, the memory controller issues $A*2^M$ refresh commands, one to each row address, no less than once every maximum refresh interval. Refresh commands operate on an entire row of cells at one time within one sub-array and treat the N least significant bits 612a of the memory address 612 as "don't cares".

When performing read and write operations, the contents of the entire row containing the addressed word are refreshed. Therefore, applications that can guarantee at least one word within every row will be the target of a read or write command at intervals less than or equal to the maximum refresh interval do not need to perform explicit refresh commands.

The DRAM architecture and circuits which embody the present invention described above are targeted for a plurality of high performance applications. The architecture and circuits of the present invention replace the dual access class model of traditional DRAM architectures. As a result, there is no longer an explicit division of memory addresses into row and column components and the memory interface does not include a concept of row state. Without a row state, there is no subdivision of memory capacity into banks, nor are there commands to explicitly open and close rows. The architecture supports and requires read, write, and refresh commands. The latency and cycle-time of these operations are therefore constant and do not depend on the value of the input address.

Because a visible row state is not supported, the state of all DRAM arrays appears the same at the start of every operation. The initial conditions for all operations are all word lines precharged low and all bit lines and data lines equalized and precharged to a precharge voltage. Each memory operation performs a complete row access operation and subsequent bit line and data line equalization and precharge. This greatly simplifies the design of the external memory controller since it no longer needs to track open banks. Because a visible row state is not supported, the state of all DRAM arrays appears the same at the start of every operation. The initial conditions for all operations are all word lines precharged low and all bit lines and data lines equalized and precharged to a precharge voltage. Each memory operation performs a complete row access operation and subsequent bit line and data line equalization and precharge. This greatly simplifies the design of the external memory controller since it no longer needs to track open banks.

Furthermore, the external memory controller does not need to check the address of each read or write operation to choose the appropriate DRAM command sequence to carry out the operation. By comparison, in conventional DRAM systems, the memory controller has to determine if the memory address it wants to access will hit an open page of a bank, a closed bank, or a bank open to a different page.

Although the above implementation has been described with reference to a specific embodiment, various modifications will be apparent to a person skilled in the art. For example, replacing the differential sampling flip-flop 936 with a differential amplifier can reduce the read latency from two to one clock cycles given sufficient reduction in the maximum operating clock rate. Conversely, a very large capacity DRAM implemented using the architecture described above may employ one or more extra pipeline register stages in the read data or write data internal paths within the memory. This may be done in order to increase the maximum clock of the memory or to increase the read data to clock set up time available to the external memory controller. The situation is similar for a DRAM with a very high degree of decimation into many sub-arrays.

The present embodiment of the invention provides extra row and column elements within each memory cell sub-array for redundancy-based repair of some types of manufacturing defects. Generally, this practice slightly increases the size of a sub-array and introduces small delays in memory access. This is due to slower sub-array operations and the need to compare an input address against a list of defective addresses before asserting a word line driver in the case of row redundancy or a column in the case of column redundancy. The timing sequences described in the present embodiment can remove some or all of the row address redundancy comparison delay component of the memory cycle time by overlapping it with the bit line equalization and pre-charge at the beginning of a row cycle. However, an alternate possibility is to exclude redundant elements from a sub-array altogether and instead equip the memory device or macro block with a surplus of sub-arrays for the purpose of repair by redundant substitution of defective sub-arrays.

Column redundancy is implemented by placing multiplexers (not shown in FIG. 9) between the sub-array group data lines 926 and sampling flip flops 936/write buffers 930 for allowing substitution of redundant column elements for regular data elements. In addition, complementary redundant element data line pairs can be substituted for complementary regular data line pairs either singularly or as part of larger groups. Data line equalization and precharge circuitry is located on the memory array side of the data line redundancy multiplexers for minimizing the time necessary for performing this operation.

The practice of performing bit line pre-charge and equalization in a first portion of a row cycle followed by a $WTP_i$ initiated timing sequence for accessing a selected row has several advantages over conventional embodiments. The delay element D1 used for delaying the assertion of the word line timing pulse ($WTP_i$) after the rising edge of the input clock, is designed to generate the minimum necessary duration during which $WTP_i$ is low. This minimum necessary low duration of the $WTP_i$ is designed to ensure adequate bit line equalization and pre-charge under worst case conditions of process variation and supply voltage and device temperature. As a result, the word line timing pulse $WTP_i$ is as precise as possible.

Figure 11A:
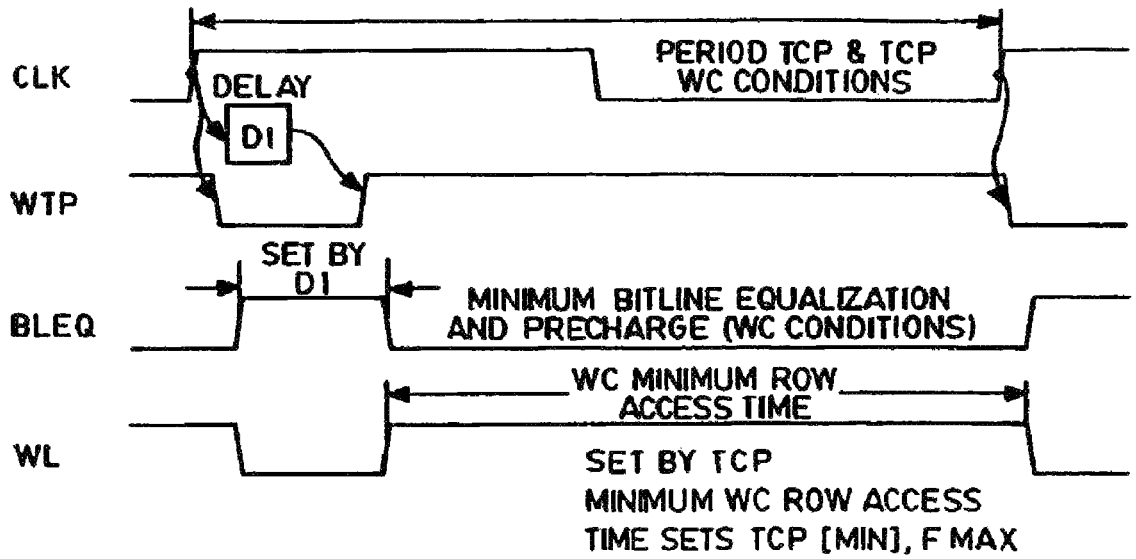
FIG. 11a is a timing diagram illustrating the minimum timing requirements for bit line equalization and precharge and access time.

Referring to FIG. 11a, a timing diagram illustrating this correlation between the delay element D1 and bit line equalization is illustrated. The maximum clock rate of the memory is set by the necessary $WTP_i$ high duration under worst case conditions to reliably perform a row access and read or write operation. The fraction of the clock period consumed by the $WTP_i$ low period, and therefore bit line equalization and pre-charge between consecutive operations, is a maximum for memory operation at a maximum clock rate under worst case delay conditions of process, voltage and temperature.

Figure 11B:
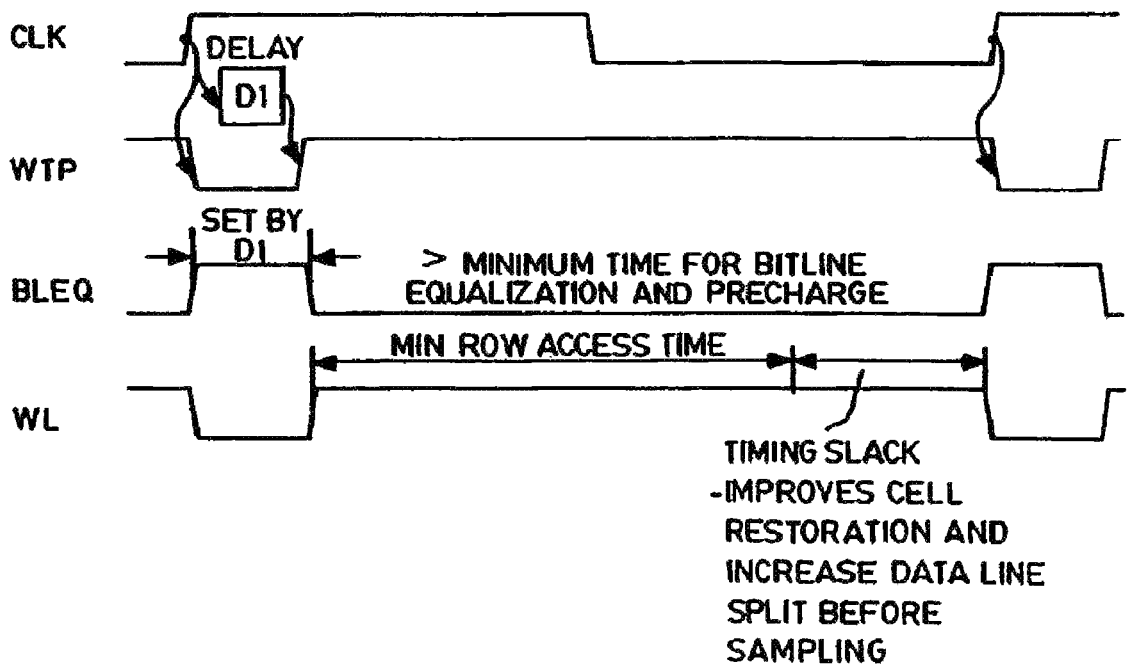
FIG. 11b is a timing diagram illustrating the benefit of a circuit operating at better than minimal conditions.

For operation at a slower clock rate, or under conditions better than the worst case logic delay, the fraction of the clock period during which $WTP_i$ is low between consecutive operations is reduced. This increases the time a selected word line is asserted during a sub-array row access. Thus, the quality of memory cell restoration for all operations and the split voltage on the data lines for read operations is increased. Referring to FIG. 11b, a timing diagram illustrating a memory operating at a slower than maximum clock rate or under conditions better than worst case logic delay is illustrated.

Figure 12A:
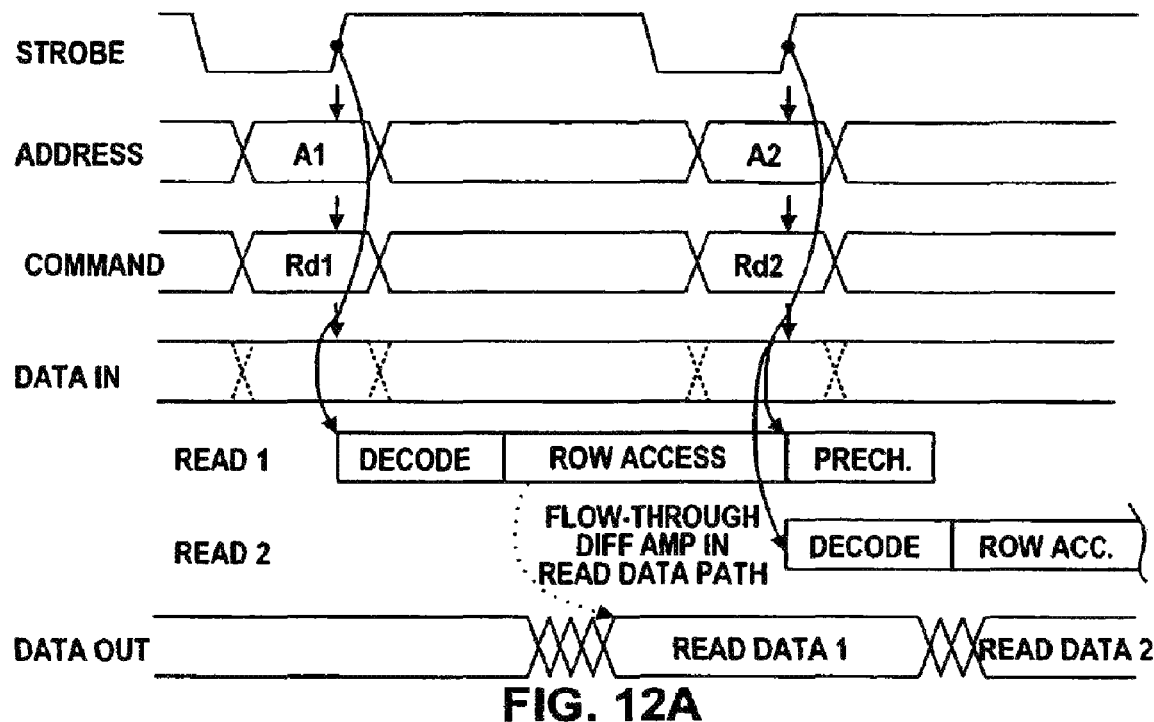
FIG. 12a is a timing and pipeline flow diagram for an asynchronous embodiment of the memory architecture illustrated in FIG. 6.

The present embodiment also describes a system using a synchronous interface that accepts and performs commands at a rate of one command per period of the interface input clock. However, it will be apparent to a person skilled in the art to implement the DRAM architecture described above using an asynchronous interface. A timing diagram for an asynchronous interface is illustrated in FIG. 12a.

Figure 12B:
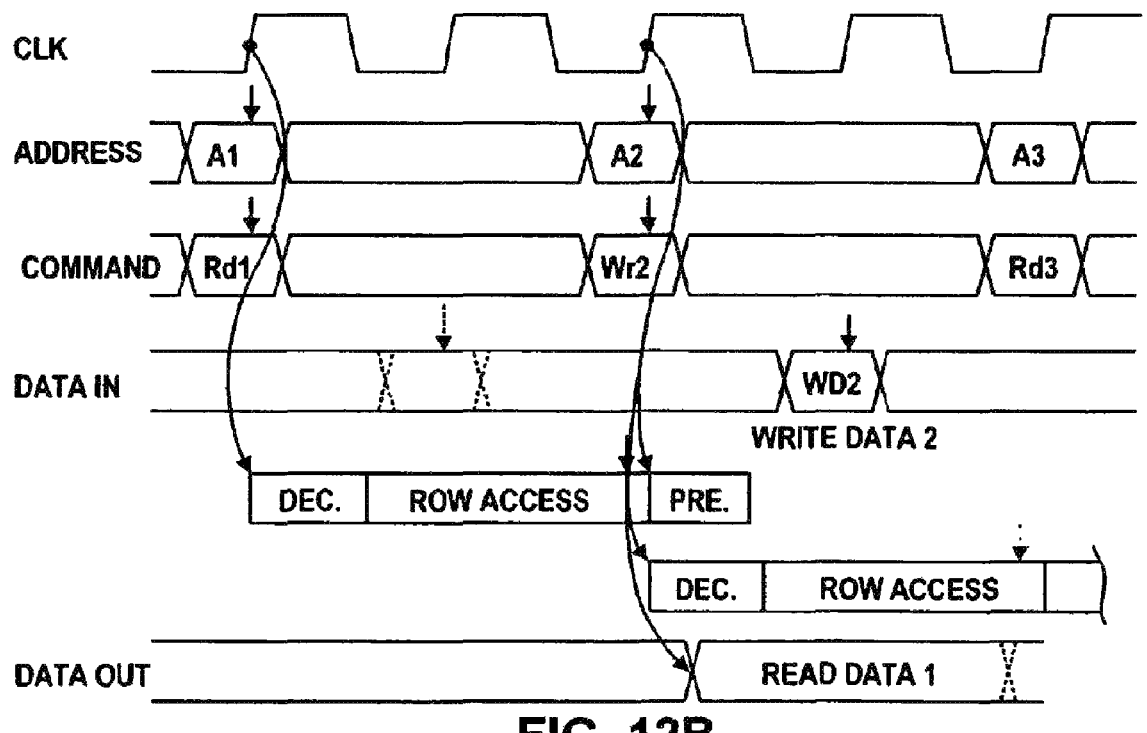
FIG. 12b is a timing and pipeline flow diagram for an embodiment that requires two clock cycles for a sub-array access.

In yet another alternate embodiment, a synchronous interface that stretches sub-array access across two or more periods of the interface clock is also possible. Referring to FIG. 12b, a timing diagram for such an embodiment is illustrated. In yet another alternate embodiment, a synchronous interface that stretches sub-array access across two or more periods of the interface clock is also possible. Referring to FIG. 12b, a timing diagram for such an embodiment is illustrated.

Figure 13A:
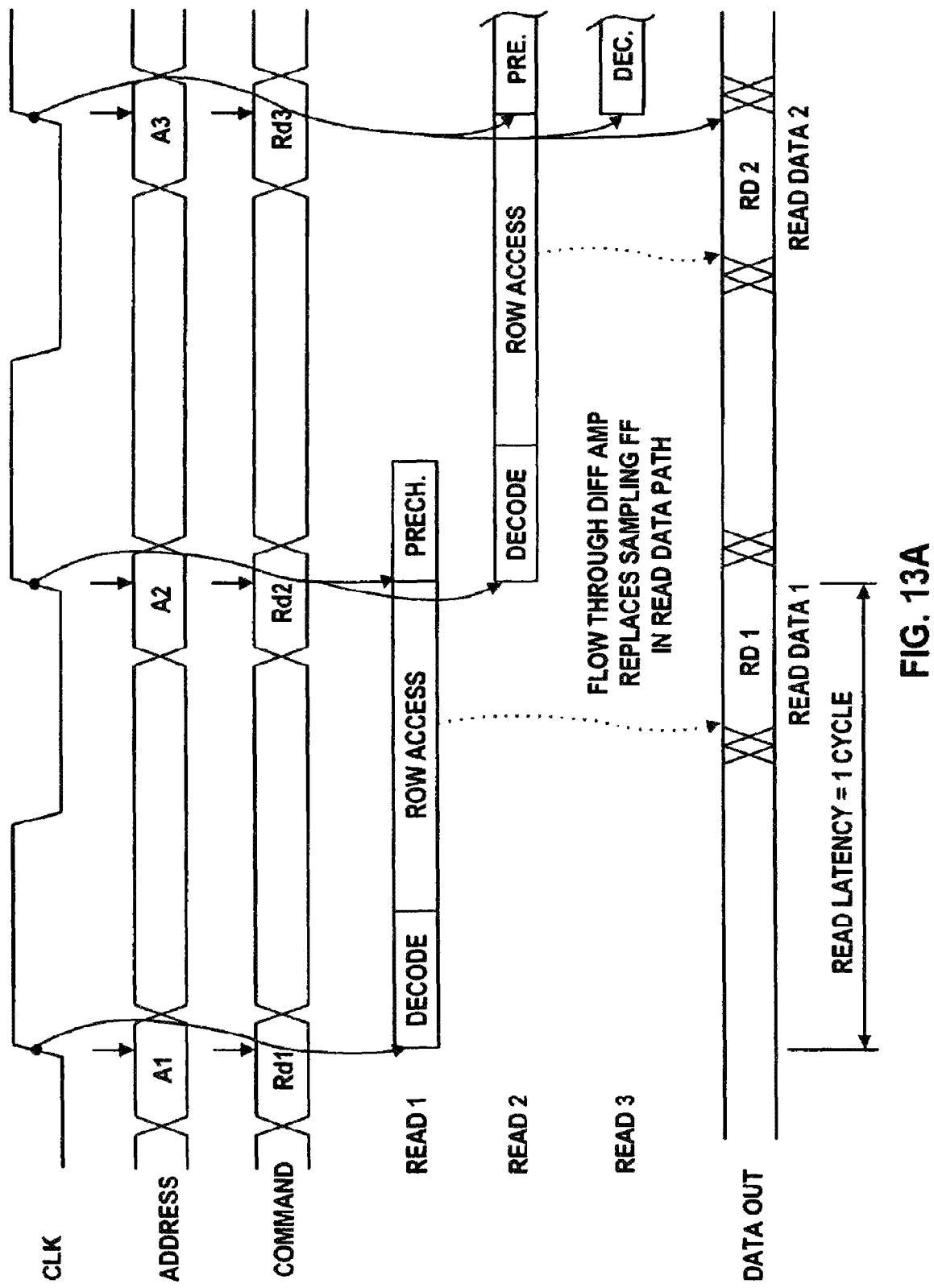
FIG. 13a is a timing and pipeline flow diagram for an embodiment that requires one clock cycle for sub-array access and has a one clock cycle latency.

In yet another alternate embodiment, a synchronous interface that performs operations at the rate of one per clock cycle with read data latency of one clock cycle is possible. Such an embodiment is illustrated in FIG. 13a.

In yet an another alternate embodiment, a synchronous interface that performs operations at the rate of one per clock cycle with read data latency of three or more clock cycles is implemented. Such an embodiment is illustrated in FIG. 13B.

Although the invention has been described with reference to certain specific embodiments, various modifications thereof will be apparent to those skilled in the art without departing from the spirit and scope of the invention as outlined in the claims appended hereto. Furthermore, the invention is applicable to any type of electronic memory that utilizes redundant storage elements for increasing efficient yield. These include, but are not limited to SRAM and various non-volatile memories such EPROM, EEPROM, flash EPROM, and FRAM.

What is claimed is:

1. A random access memory comprising:
 a plurality of memory storage elements arranged in rows and columns and each memory element coupled to a bit line and a word line,
 an address register for receiving an address on a first clock edge,
 a precharge circuit for precharging the bit line, the precharge circuit responsive to the first clock edge,
 a row decoder for:
  decoding a first segment of the address; and
  activating a word line corresponding to the first segment of the address,
 a delay circuit for timing deactivation of the precharge circuit and the activation of the word line,
 a column decoder for:
  decoding a second segment of the address; and
  selecting a bit line corresponding to the second segment of the address,
 a sense amplifier for:
  sensing data on the bit line; and
  restoring data in the memory element coupled to the selected bit line and the activated word line, and
 an output circuit for outputting the data.

2. The random access memory as claimed in claim 1 wherein a number of memory elements per bit line is substantially less than in a conventional random access memory adapted for a same process technology.

3. The random access memory as claimed in claim 1 wherein the number of memory elements per bit line is about one quarter of that in the conventional random access memory.

4. The random access memory as claimed in claim 1 wherein the output circuit is an output circuit for outputting the data in response to a second clock edge.

5. The random access memory as claimed in claim 4 wherein a latency time from the first clock edge to the second clock edge is substantially the same for executing reading, writing, and refreshing data commands.

6. The random access memory as claimed in claim 1 wherein the random access memory is a dynamic random access memory.

7. The random access memory as claimed in claim 1 wherein the random access memory is an embedded dynamic random access memory.

* * * * *